United States Patent
Phillips et al.

(10) Patent No.: US 9,323,157 B2
(45) Date of Patent: Apr. 26, 2016

(54) MIRROR ASSEMBLY FOR AN EXPOSURE APPARATUS

(75) Inventors: Alton H. Phillips, East Palo Alto, CA (US); Douglas C. Watson, Campbell, CA (US); Lorri L. Watson, legal representative, Campbell, CA (US)

(73) Assignee: Nikon Corporation (JP)

( * ) Notice: Subject to any disclaimer, the term of this patent is extended or adjusted under 35 U.S.C. 154(b) by 123 days.

(21) Appl. No.: 14/116,634

(22) PCT Filed: Jun. 13, 2012

(86) PCT No.: PCT/US2012/042250
§ 371 (c)(1),
(2), (4) Date: Nov. 8, 2013

(87) PCT Pub. No.: WO2012/174108
PCT Pub. Date: Dec. 20, 2012

(65) Prior Publication Data
US 2014/0078485 A1    Mar. 20, 2014

Related U.S. Application Data

(60) Provisional application No. 61/497,881, filed on Jun. 16, 2011.

(51) Int. Cl.
G03B 27/54    (2006.01)
G03F 7/20     (2006.01)
G02B 7/18     (2006.01)

(52) U.S. Cl.
CPC ............ *G03F 7/7015* (2013.01); *G02B 7/1815* (2013.01)

(58) Field of Classification Search
CPC ...... G03F 7/7015; G02B 7/1815; G02B 7/00; G02B 7/008

USPC .......................................................... 355/67
See application file for complete search history.

(56) References Cited

U.S. PATENT DOCUMENTS 4,443,059 A    4/1984   Wells
6,959,992 B2   11/2005  Bischof
(Continued)

FOREIGN PATENT DOCUMENTS

DE    19622472 C1    12/1997

OTHER PUBLICATIONS

Howells, Malcolm R., Some fundamentals of cooled mirrors for synchroton radiation beam lines, Apr. 1996,Opt. Eng.35(4) 1187-1197 © 1996 Society of Photo-Optical Instrumentation Engineers, Bellingham, WA, US.

(Continued)

*Primary Examiner* — Peter B Kim
(74) *Attorney, Agent, or Firm* — Roeder & Broder LLP

(57) ABSTRACT

A mirror assembly (332) for directing a beam (28) from an illumination source (26) to a reticle (36) includes a mirror (352) and a back plate (350). The mirror (352) includes a mirror body (352A) that defines a reflective first surface (352B) that directs the beam (28), a mirror mounting region (370), a mirror perimeter region (372) that encircles the mirror mounting region (370), and mirror slot (374) that separates the mirror perimeter region (372) from the mirror mounting region (370). The back plate (350) retains and engages the mirror mounting region (370) of the mirror (352) with the mirror perimeter region (372) spaced apart from the back plate (350). Further, the mirror body (352A) can include a second surface (352C) that is substantially opposite the first surface (352B), and the mirror mounting region (370) extends between the second surface (352C) to near the first surface (352B). Further, the mirror slot (374) extends from the second surface (352C) to near the first surface (352B).

25 Claims, 10 Drawing Sheets

(56) References Cited

U.S. PATENT DOCUMENTS

| | | |
|---|---|---|
| 2007/0091485 A1 | 4/2007 | Phillips et al. |
| 2008/0003649 A1 | 1/2008 | Maltezos et al. |
| 2008/0061306 A1 | 3/2008 | Chiu et al. |
| 2008/0144202 A1 | 6/2008 | Wevers et al. |
| 2009/0122429 A1 | 5/2009 | Watson et al. |
| 2010/0110397 A1 | 5/2010 | Phillips |
| 2010/0200777 A1 | 8/2010 | Hauf |

OTHER PUBLICATIONS

Howells, M.R., Some ideas on the choice of designs and materials for cooled mirrors, Feb. 1995, Advanced Light Source Accelerator and Fusion Research Division, Lawrence Berkeley Laboratory, University of California, Berkeley, CA, US.

The International Search Report and the Written Opinion of the International Searching Authority, Aug. 27, 2012, for Application No. PCT/US2012/042250 (related application).

The International Preliminary Report on Patentability of the International Searching Authority, Dec. 17, 2013, for Application No. PCT/US2012/042250 (related application).

MIRROR ASSEMBLY FOR AN EXPOSURE APPARATUS

BACKGROUND

Lithography systems are commonly used to transfer images from a reticle onto a semiconductor wafer during semiconductor processing. A typical lithography system includes an illumination system, a reticle stage assembly that positions a reticle, an optical assembly and a wafer stage assembly that positions a semiconductor wafer. The illumination system includes an illumination source that generates an illumination beam, and an illumination optical assembly that directs the illumination beam at the reticle.

The size of the features within the images transferred from the reticle onto the wafer is extremely small. In order to increase the resolution of the features and decrease the size of the features within the images, there is a need to use an illumination source that generates smaller or shorter wavelengths of light. For example, extreme ultraviolet (EUV) radiation, including wavelengths in the 11 to 14 nm range, is being evaluated for use in lithography systems. For extreme ultraviolet lithography systems, the optical assembly typically includes one or more reflective, optical elements, e.g. mirrors.

With EUV lithography systems, an EUV source generates the EUV beam, while an illumination optical assembly directs the EUV beam at the reticle. A typical illumination optical assembly includes one or more mirror assemblies that reflect and direct the EUV beam at the reticle. Unfortunately, existing coatings for the mirror assembly only reflect a portion of the EUV beam. As a result thereof, the mirror assembly absorbs a portion of the EUV beam. This heats the mirror assembly and can deform the mirror assembly. Further, the deformation of the mirror assembly can adversely influence the EUV beam reflected off of the mirror assembly.

SUMMARY

One aspect of this invention is directed to mirror assembly for directing a beam from an illumination source to a reticle. The mirror assembly can include a first mirror and a back plate. In one embodiment, the first mirror includes a mirror body that defines a reflective, first surface that redirects the beam, a mirror mounting region, a mirror perimeter region that encircles the mirror mounting region, and mirror slot that separates the mirror perimeter region from the mirror mounting region. The back plate retains and engages the mirror mounting region of the first mirror with the mirror perimeter region spaced apart from the back plate.

In certain embodiments, the beam is an EUV beam that has a relatively short wavelength. As provided above, existing coatings only reflect a portion of the EUV beam. As a result thereof, the mirror absorbs a portion of the EUV beam and the mirror is heated by the absorbed EUV beam. This heats the mirror and can deform the mirror assembly. Further, the deformation of the mirror assembly can adversely influence the EUV beam reflected off of the mirror assembly. As an overview, with the present design, the mirror perimeter region is maintained at a substantially uniform temperature while only the mirror mounting region has a temperature gradient. This reduces amount of deformation of the mirror because only a portion of the mirror has a temperature gradient.

In one embodiment, the mirror body includes a second surface that is substantially opposite the first surface, and the mirror mounting region extends between the second surface to near the first surface. Further, the mirror slot extends from near the second surface to near the first surface.

As provided herein, the mirror mounting region can be substantially rectangular shaped. Alternatively, the mirror mounting region can be substantially pyramid shaped.

In certain embodiments, the back plate includes a plate body that defines a first plate mounting region that engages the mirror mounting region of the first mirror and a first plate slot that encircles the first plate mounting region. Further, the plate body can include a longitudinal axis, and wherein the plate body defines a first symmetry region that is opposite the first plate mounting region relative to the longitudinal axis, and a first symmetry slot that encircles the first symmetry region. Moreover, the back plate can include a circulation conduit for directing a circulation fluid through the back plate to control the temperature of the back plate.

In still another embodiment, the mirror assembly includes a second mirror that includes a mirror body that defines a reflective, first surface that redirects the beam, a mirror mounting region, a mirror perimeter region that encircles the mirror mounting region, and a mirror slot that separates the mirror perimeter region from the mirror mounting region. In this embodiment, the back plate retains and engages the mirror mounting region of the second mirror with the mirror perimeter region spaced apart from the back plate.

The present invention is also directed to an exposure assembly for transferring an image from a reticle to a wafer. For example, the exposure assembly can include a reticle stage that retains and positions the reticle; a wafer stage that retains and positions the wafer; an illumination source that generates a beam; and the mirror assembly described above that directs the beam from the illumination source to the reticle.

The present invention is also directed to a process for manufacturing a device that includes the steps of providing a substrate and forming an image on the substrate with the exposure apparatus described above. Further, the present invention is directed to a method for directing a beam from an illumination source to a reticle.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
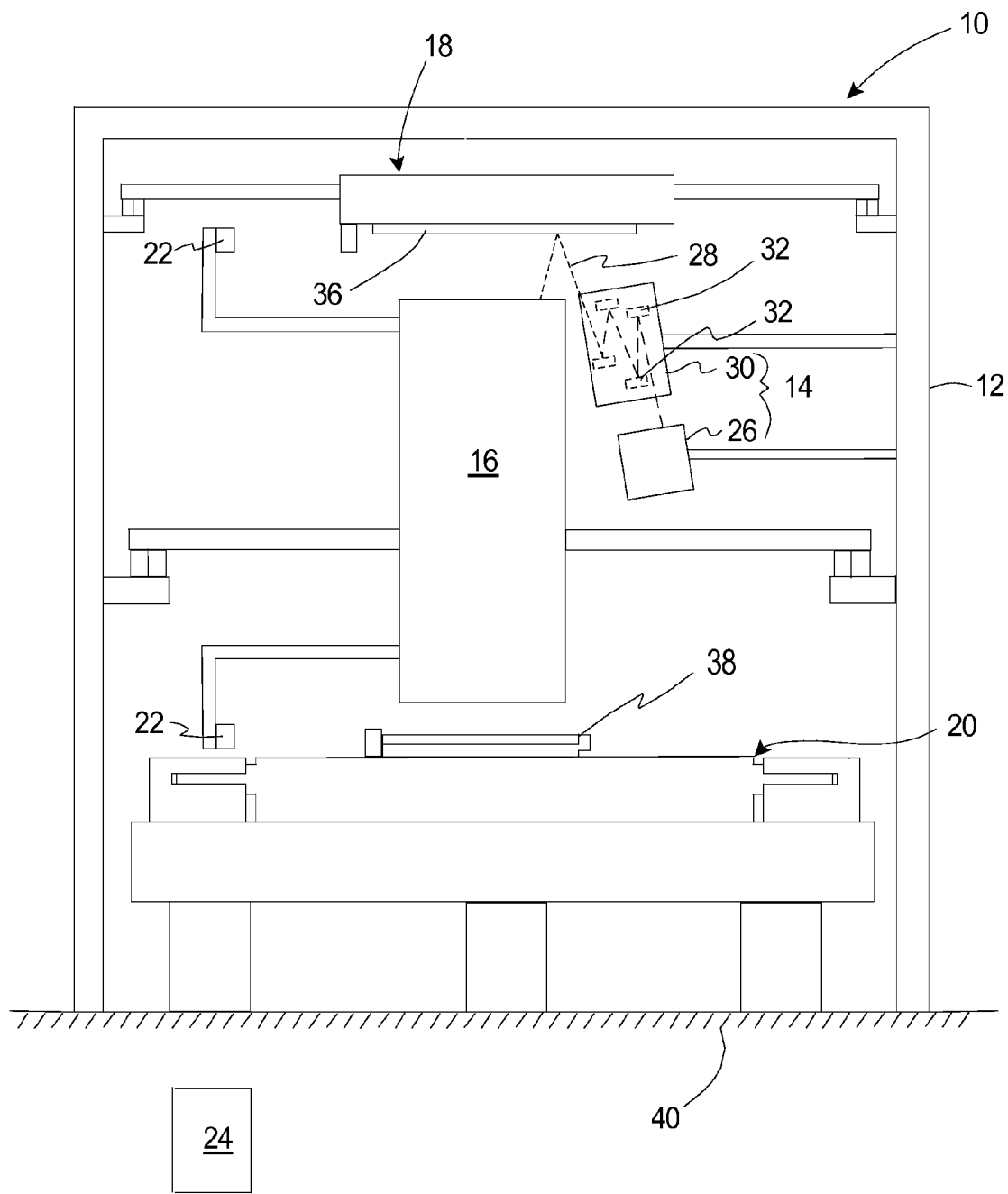
FIG. 1 is directed to a schematic view of a lithography system having features of the present invention.

FIG. 1 is a schematic illustration of a precision assembly, namely an exposure apparatus 10 (also referred to as a lithography apparatus) having features of the present invention. The exposure apparatus 10 includes an apparatus frame 12, an illumination system 14 (irradiation apparatus), an output optical assembly 16, a reticle stage assembly 18, a wafer stage assembly 20, a measurement system 22, and a control system 24. The design of the components of the exposure apparatus 10 can be varied to suit the design requirements of the exposure apparatus 10.

As an overview, in certain embodiments, the illumination system 14 includes an illumination source 26 that generates a short wavelength illumination beam 28 (illustrated with dashed lines), and an illumination optical assembly 30 that includes one or more mirror assemblies 32 (two are illustrated in phantom) that are used to condition the illumination beam 28. As provided herein, materials are currently not available which provide very high reflectivities for the mirror assemblies 32 at the short wavelength of the illumination beam 28. As a result, significant amounts of optical power are absorbed in the surfaces of the mirror assemblies 32. As provided herein, the mirror assemblies 32 are uniquely designed to minimize the amount of distortion caused by the power absorbed by the mirror assemblies 32.

A number of Figures include an orientation system that illustrates an X axis, a Y axis that is orthogonal to the X axis, and a Z axis that is orthogonal to the X and Y axes. It should be noted that any of these axes can also be referred to as the first, second, and/or third axes.

The exposure apparatus 10 is particularly useful as a lithographic device that transfers a pattern (not shown) of an integrated circuit from a reticle 36 onto a semiconductor wafer 38. The exposure apparatus 10 mounts to a mounting base 40, e.g., the ground, a base, or floor or some other supporting structure.

There are a number of different types of lithographic devices. For example, the exposure apparatus 10 can be used as a scanning type photolithography system that exposes the pattern from the reticle 36 onto the wafer 38 with the reticle 36 and the wafer 38 moving synchronously. Alternatively, the exposure apparatus 10 can be a step-and-repeat type photolithography system that exposes the reticle 36 while the reticle 36 and the wafer 38 are stationary. However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The reticle 36 can be a reflective type as illustrated in FIG. 1. The pattern in the reticle 36 that is to be transferred to the wafer 38 is defined by the local regions of the reticle 36 where the reflectivity at the illumination radiation wavelengths of the reticle surface has been reduced to a very small value, thereby providing maximum image contrast at the wafer 38.

The wafer 38 includes a substrate that is covered with a photoresist. The photoresist can be photosensitive to some wavelengths of radiation and not sensitive to other wavelengths of radiation. For example, the photoresist can be sensitive to extreme electromagnetic ultraviolet radiation including wavelengths in the 10 to 15 nm range.

The apparatus frame 12 is rigid and supports the components of the exposure apparatus 10. The apparatus frame 12 illustrated in FIG. 1 supports the reticle stage assembly 18, the optical assembly 16 and the illumination system 14 above the mounting base 40.

The illumination source 26 emits the illumination beam 28 (irradiation) of light energy. The illumination optical assembly 30 guides the beam of light energy 28 from the illumination source 26 to the reticle 36. The beam 28 illuminates selectively different portions of the reticle 36 and exposes the wafer 38. In FIG. 1, the illumination source 26 is illustrated as being supported by the apparatus frame 12.

Radiation reflected from the reticle 36 is directed by the optical assembly 16 on the semiconductor wafer 38 to expose the photosensitive resist.

In one embodiment, the illumination source 26 generates an extreme ultraviolet (EUV) illumination beam 28, including illumination wavelengths of between approximately 10-15 nm and typically illumination wavelengths in the 11 to 14 nm range, also referred to as the soft X-ray region. In this design, the illumination source 26 can be a synchrotron radiation source or laser plasma source. Alternatively, for example, the illumination source 26 can be a gas discharge source.

The illumination optical assembly 30 is described in more detail below.

The output optical assembly 16 collects and focuses the illumination beam 28 that is reflected from the reticle 36 to the wafer 38. For an EUV illumination source 26, the optical assembly 16 is an all reflective system that includes one or more mirrors (not shown) that collect and focus the illumination beam 28. The number of mirrors and the arrangement of the mirrors can be varied to suit the requirements of the optical assembly 16.

The reticle stage assembly 18 holds and positions the reticle 36 relative to the output optical assembly 16 and the wafer 38. Somewhat similarly, the wafer stage assembly 20 holds and positions the wafer 38 with respect to the projected image of the illuminated portions of the reticle 36.

In one embodiment, one or more linear motors can be used in the reticle stage assembly 18 and/or the wafer stage assembly 20. When linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

The measurement system 22 monitors movement of the reticle 36 and the wafer 38 relative to the optical assembly 16 or some other reference. With this information, the control system 24 can control the reticle stage assembly 18 to precisely position the reticle 36 and the wafer stage assembly 20 to precisely position the wafer 38. For example, the measurement system 22 can utilize multiple laser interferometers, encoders, and/or other measuring devices.

The control system 24 is connected to the reticle stage assembly 18, the wafer stage assembly 20, and the measurement system 22. The control system 24 receives information from the measurement system 22 and controls the stage mover assemblies 18, 20 to precisely position the reticle 36 and the wafer 38. The control system 24 can include one or more processors and circuits.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

It should be noted that for an EUV system, that the illumination beam 28 should travel in a vacuum. For example, the illumination source 26, the illumination optical assembly 30, the reticle stage assembly 18, the output optical assembly 16, and the wafer stage assembly 20 can be positioned within a vacuum chamber (not shown).

Figure 2:
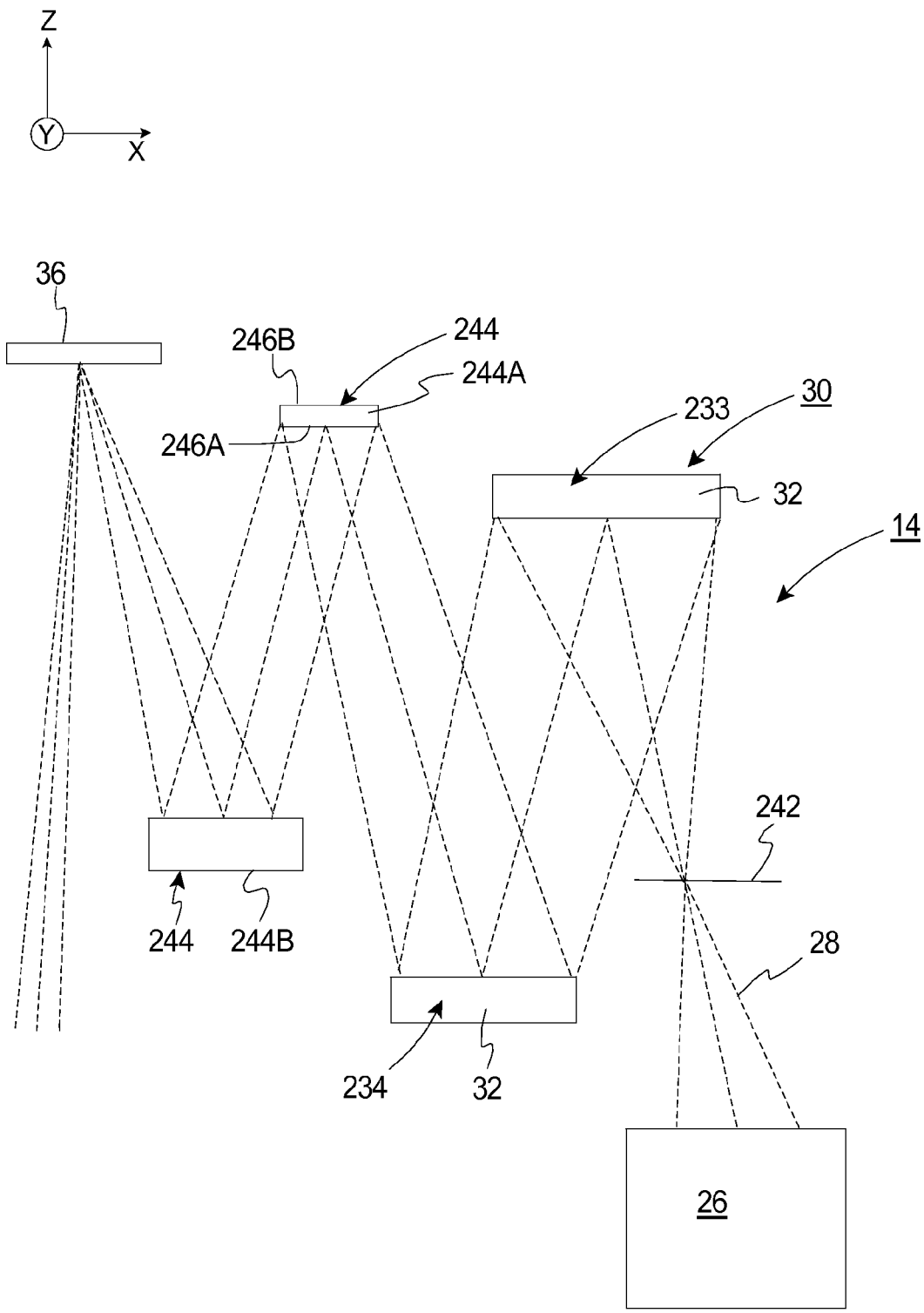
FIG. 2 is a simplified illustration of an illumination system having features of the present invention and a reticle.

FIG. 2 is a simplified illustration of the illumination system 14 and the reticle 36. In this embodiment, the illumination system 14 includes the illumination source 26 that generates the illumination beam 28, and the illumination optical assembly 30 that directs the illumination beam 28 at the reticle 36. Further, in this embodiment, the illumination optical assembly 30 includes a focus plate 242, one or more condenser elements 244 (illustrated as boxes), and one or more mirror assemblies 32 (illustrated as boxes). The design and positioning of each of these components can be varied pursuant to the teachings provided herein.

The focus plate 242 creates an intermediate focus point for the illumination beam 28. In one non-exclusive embodiment, the focus plate 242 is a generally flat plate that includes an aperture so that the illumination beam 28 can pass therethrough.

The condenser elements 244 direct and focus the illumination beam 28 reflected off of the mirror assemblies 32 onto the reticle 36. In FIG. 2, the illumination optical assembly 30 includes two condenser elements 244, namely a first condenser element 244A and a second condenser element 244B. Alternatively, the illumination optical assembly 30 can include more than two condenser elements 244.

In one embodiment, each of the condenser elements 244 is a mirror that includes a front surface 246A and an opposed rear surface 246B. The front surface 246A defines a figure that is curved so that the light rays that strike the front surface 246A converge or diverge. The front surface 246A is coated with multiple thin layers of material that collectively create a fairly reflective surface at the wavelength of the illumination beam 28. The type of material utilized for the layers of reflective material will depend upon the wavelength of the radiation generated by the illumination source 26. For example, suitable layers include molybdenum/silicon for wavelengths of approximately 13 nm and molybdenum/beryllium for wavelengths of approximately 11 nm. However, other materials may be utilized.

At the short wavelengths of EUV radiation, materials are currently not available for the reflective thin layers which will provide very high reflectivities typical of optical reflective coatings at visible and near visible wavelengths. Achievable reflectivities may not exceed much more than $r=0.65$, as compared to greater than 0.99 at longer wavelengths. As a result, significant amounts of optical power are absorbed in the surfaces of the optical elements. In one embodiment, each condenser element 244 can include one or more circulating channels (not shown) that extend through the condenser elements 244 for cooling the condenser elements 244. The circulating channels can be positioned in the condenser elements 244 so that a circulating fluid can be circulated relatively evenly throughout the condenser elements 244.

In FIG. 2, the illumination optical assembly 30 includes a first mirror assembly 233 (illustrated as a box) and the second mirror assembly 234 (illustrated in box) that adjust and change the illumination conditions of the illumination beam 28. In FIG. 2, the illumination beam 28 is directed from the illumination source 26, through the focus plate 242 and at the first mirror assembly 233. Further, light reflected off of the first mirror assembly 233 is directed at the second mirror assembly 234. Subsequently, light reflected off of the second mirror assembly 234 is directed at the first condenser element 244A. Next, light reflected off of the first condenser element 244A is directed at the second condenser element 244B. Finally, light reflected off of the second condenser element 244B is directed at the reticle 36.

As provided herein, the first mirror assembly 233 can be referred to as a first fly-eye optical system, and the second mirror assembly 234 can be referred to as a second fly-eye optical system.

Figure 3A:
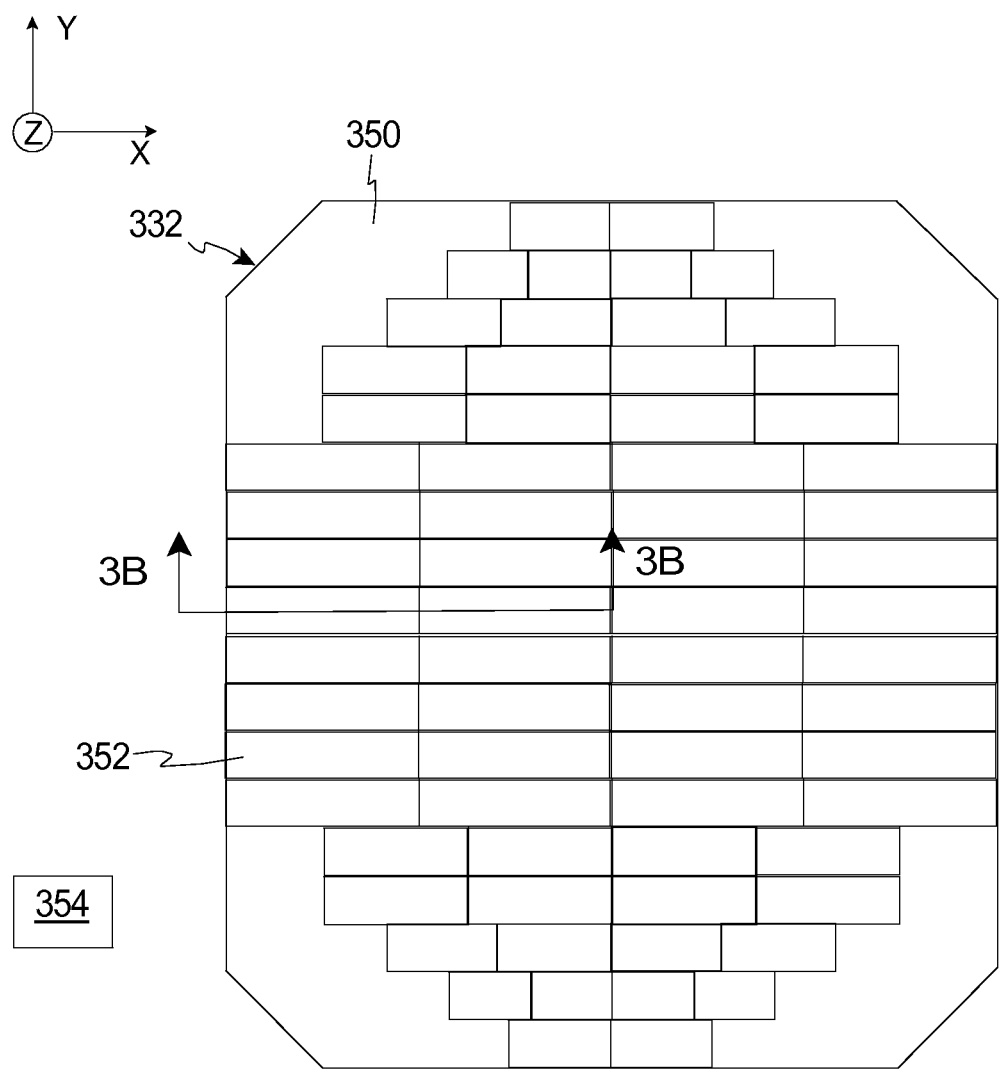
FIG. 3A is a top view of a mirror assembly having features of the present invention.

FIG. 3A is a top view of a first embodiment of a mirror assembly 332 having features of the present invention. For example, the mirror assembly 332 can be used as the first mirror assembly 233 (illustrated in FIG. 2) or the second mirror assembly 234 (illustrated in FIG. 2) of the illumination optical assembly 30 (illustrated in FIG. 2). Alternatively, the mirror assembly 332 can be used in another type of optical assembly (not shown).

In FIG. 3A, the mirror assembly 332 includes a back plate 350, a plurality of individual mirrors 352 that are secured to the back plate 350, and a circulation system 354 (illustrated as a box) that can be used to circulate a fluid (not shown) through the back plate 350 for actively controlling the temperature of the back plate 350 and the mirrors 352. The number, shape, and the arrangement of the mirrors 352 can be varied to achieve the design requirements of the mirror assembly 332. In FIG. 3A, the mirror assembly 332 includes sixty-eight, generally rectangular shaped mirrors 352 that are arranged in close proximity and adjacent to each other, and all of these individual mirrors 352 are approximately in the same plane. Moreover, in this embodiment, the mirror assembly 332 includes eighteen rows of mirrors 352 that are positioned side by side, with (i) sixteen rows that include four mirrors 352 that are aligned end-to-end, and (ii) two rows that include two mirrors 352 that are aligned end-to-end. Alternatively, the mirror assembly 332 can be designed to include more than sixty-eight mirrors 352 or fewer than sixty-eight mirrors 352, and the arrangement of the mirrors 352 can be different than that illustrated in FIG. 3A. Further, the mirrors 352 can have a configuration different than rectangular shaped.

It should be noted that any of these mirrors 352, can be referred to as a first mirror, a second mirror, a third mirror or fourth mirror for convenience.

Figure 3B:
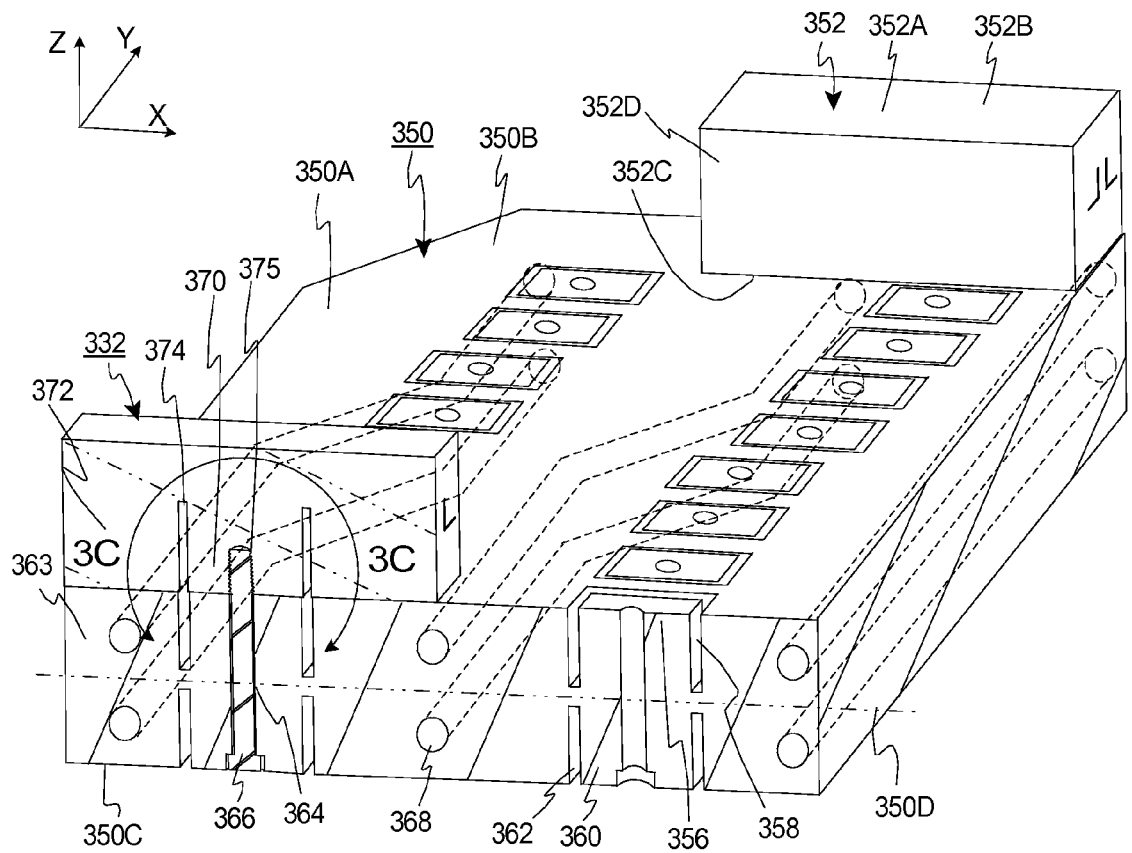
FIG. 3B is a perspective, cut-away view taken on line 3B-3B of FIG. 3A with a portion of the mirror assembly removed for clarity.

FIG. 3B is a perspective, cut-away view taken on line 3B-3B of FIG. 3A with a portion of the mirror assembly 332 removed for clarity. More specifically, FIG. 3B illustrates approximately one quarter of the back plate 350, one full mirror 352, and approximately one-half of another mirror 352.

In this embodiment, the back plate 350 is rigid, and supports the mirrors 352. In FIG. 3B, the back plate 350 includes a generally rectangular shaped plate body 350A that includes (i) a planar, upper first plate surface 350B, and (ii) a planar, lower second plate surface 350C that is opposite the first plate surface 350B. Further, a longitudinal plane 350D divides the plate body 350A symmetrically between the first plate surface 350B and the second plate surface 350C.

Additionally, the plate body 350A defines (i) a plurality of spaced apart, plate mounting regions 356 that are used to secure the mirrors 352, (ii) a plurality of plate slots 358, (iii) a plurality of spaced apart symmetry regions 360 that are used to provide symmetry relative to the plate mounting regions 356, (iv) a plurality of symmetry slots 362, and (v) a plate surrounding region 363 that makes up the rest of the plate body 350A. In this embodiment, the plate surrounding region 363 is generally rectangular shaped and encircles the plate mounting regions 356 and the symmetry regions 360. As provided herein, each mirror 352 is mounted to one of the plate mounting regions 356, and each plate mounting regions 356 is defined and encircled by one of the plate slots 358. Thus, the number of plate mounting regions 356 and the number of plate slots 358 is equal to the number of mirrors 352. As provided above, in this embodiment, the mirror assembly 332 includes sixty-eight mirrors 352. As a result thereof, the plate body 350A includes sixty-eight plate mounting regions 356 and sixty-eight plate slots 358. Alternatively, the plate body 350A can include more than or fewer than sixty-eight plate mounting regions 356.

In FIG. 3B, each of the plate slots 358 is generally rectangular tube shaped and extends downward from the first plate surface 350B towards near the longitudinal plane 350D. As a result thereof, each of the plate mounting regions 356 is generally rectangular beam shaped and extends upward from near the longitudinal plane 350 of the plate body 350A. Alternatively, each plate slot 358 and each mounting region 356 can have a different configuration. In one non-exclusive embodiment, each plate slot 358 defines a gap of between approximately 0.1 millimeters and 3 millimeters between the plate mounting region 356 and the adjacent, plate surrounding region 363.

As provided above, the plurality of symmetry regions 360 are used to provide symmetry relative to the plate mounting regions 356. Thus, each of the symmetry regions 360 is positioned substantially opposite relative to the longitudinal plane 350D to one of the plate mounting regions 356. Further, each of the symmetry regions 360 is defined and encircled by one of the symmetry slots 362. Thus, the number of symmetry regions 360 and the number of symmetry slots 362 is equal to the number of plate mounting regions 356.

In one embodiment, to provide symmetry, each of the symmetry slots 362 is similar in shape and size to each plate slot 358, and each of the symmetry regions 360 is similar in shape and size to each of the plate mounting regions 356. In FIG. 3B, each of the symmetry slots 362 is generally rectangular tube shaped and extends upward from the second plate surface 350C towards near the longitudinal plane 350D. As a result thereof, each of the symmetry regions 360 is generally rectangular beam shaped and extends downward from near the longitudinal plane 350 of the plate body 350A. Alternatively, each symmetry slot 362 and each symmetry region 360 can have a different configuration.

Additionally, the plate body 350A can include a mounting aperture 364 for each mirror 352 that extends through the symmetry region 360 and the corresponding plate mounting region 356. Moreover, for each mirror 352, a fastener 366 can extend into one of the mounting apertures 364 for securing and pulling the mirror 352 against the respective plate mounting region 356.

Further, the plate body 350A can include one or more circulation channels 368 (illustrated in phantom) that extend through the plate body 350A. With this design, a circulation fluid (not shown) can be circulated through the plate body 350A to actively control the temperature of the back plate 350 and the mirrors 352. In the embodiment illustrated in FIG. 3B, the circulation channels 368 are equally distributed above and below the longitudinal plane 350D to provide symmetry so that the circulation fluid can be circulated relatively evenly through the back plate 350D. This inhibits deformation of the back plate 350 caused by uneven temperature distribution of the back plate 350.

It should be noted that any of the plate mounting regions 356 can be referred to as a first, second, third, or fourth plate mounting regions 356; any of the plate slots 358 can be referred to as a first, second, third, or fourth plate slots 358; any of the symmetry regions 360 can be referred to as a first, second, third, or fourth symmetry regions 360; and/or any of the symmetry slots 362 can be referred to as a first, second, third, or fourth plate slots 362.

As a non-exclusive example, the plate body 350A can be made from Molybdenum or another suitable material.

In one embodiment, each mirror 352 is rigid, and includes a generally rectangular shaped mirror body 352A that has (i) an upper reflective first surface 352B, (ii) a planar, lower second mounting surface 352C that is opposite the upper reflective first surface 352B, and (iii) four sides 352D. Additionally, each mirror body 352A defines (i) a mirror mounting region 370, (ii) a mirror perimeter region 372, and (ii) a mirror slot 374 that defines and encircles the mirror mounting region 370 and that separates the mirror perimeter region 372 from the mirror mounting region 370. As a non-exclusive example, each mirror 352 can have a length of between approximately fifty and one hundred millimeters, a width of between approximately five and ten millimeters, and a height of between approximately ten and fifteen millimeters.

As provided herein, for each mirror 352, the mirror mounting region 370 engages and is mounted to one of the plate mounting regions 356. In FIG. 3B, the fastener 366 extends through the mounting aperture 364 in the back plate 350 and is threaded into an internally threaded surface 375 in the mirror mounting region 370. Alternatively, the mirror 352 can be secured to the back plate 350 in another fashion.

In FIG. 3B, for each mirror 352, the mirror slot 374 is generally rectangular tube shaped and extends upward from the mounting surface 352C towards the reflective surface 352B. As a result thereof, in this embodiment, the mirror mounting region 370 is generally rectangular shaped and extends downward from near the reflective surface 352B (between the surfaces 352B, 352C) to the mounting surface 352C. Alternatively, each mirror slot 374 and each mirror mounting region 370 can have a different configuration. In one non-exclusive embodiment, the mirror slot 374 defines a gap of between approximately one hundred microns and two millimeters between the mirror mounting region 370 and the mirror perimeter region 372.

As provided herein, the reflective surface 352B includes one or more facets that are coated with multiple thin layers of material that collectively create a fairly reflective surface at the wavelength of the illumination beam 28 (illustrated in FIG. 2). The type of material utilized for the layers of reflective material will depend upon the wavelength of the illumination beam 28. For example, suitable layers include molybdenum/silicon for wavelengths of approximately 13 nm and molybdenum/beryllium for wavelengths of approximately 11 nm. However, other materials may be utilized. As provided above, at the short wavelengths, materials are currently not available for the reflective thin layers which will provide very high reflectivities typical of optical reflective coatings at visible and near visible wavelengths. Achievable reflectivities may not exceed much more than r=0.65, as compared to greater than 0.99 at longer wavelengths. As a result, significant amounts of optical power are absorbed in the surfaces of the optical elements.

As a non-exclusive example, the mirror body 352A can be made from Molybdenum or another suitable material.

Figure 3C:
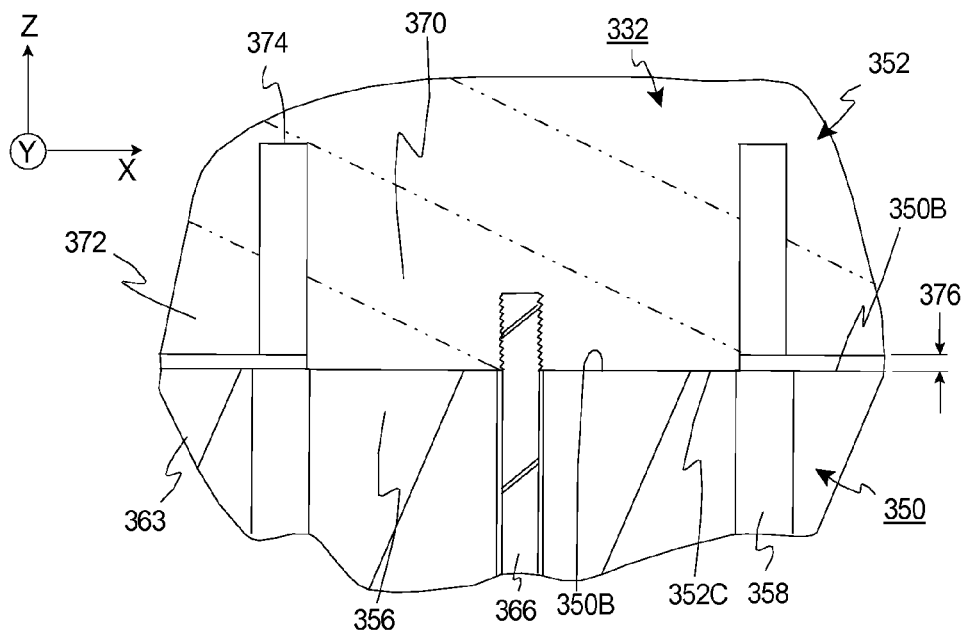
FIG. 3C is an enlarged side view taken on line 3C-3C of FIG. 3B.

FIG. 3C is an enlarged side view taken on line 3C-3C of FIG. 3B. FIG. 3C illustrates that the fastener 366 pulls the mirror mounting region 370 at the second surface 352B directly against the plate mounting region 356 while the mirror perimeter region 372 is spaced apart a mirror gap 376 from the back plate 350 with the second surface 352C of the mirror perimeter region 372 adjacent to and facing the plate surrounding region 363. Stated in another fashion, the back plate 350 retains and engages the mirror mounting region 370 with the mirror perimeter region 372 spaced apart from the back plate 350. The size of the mirror gap 376 can be varied according to the design of the system. As non-exclusive examples, the mirror gap 376 can be approximately twenty, fifty, one hundred, or five hundred microns.

Figure 4:
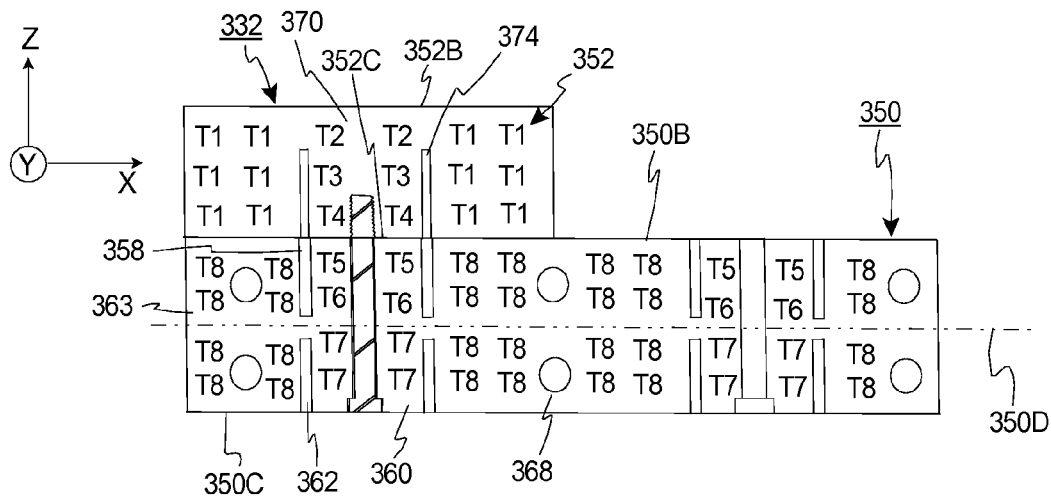
FIG. 4 is simplified end illustration of the portion of the mirror assembly of FIG. 3B including a simplified illustration of a thermal profile.

FIG. 4 is simplified end illustration of the portion of the mirror assembly 332 of FIG. 3B including a simplified illustration of a thermal profile of the mirror assembly 332 during operation of the exposure apparatus 10 (illustrated in FIG. 1). In FIG. 4, (i) the term "T1" represents a first temperature, (ii) the term "T2" represents a second temperature that is cooler than the first temperature, (iii) the term "T3" represents a third temperature that is cooler than the second temperature, (iv) the term "T4" represents a fourth temperature that is cooler than the third temperature, (v) the term "T5" represents a fifth temperature that is cooler than the fourth temperature, (vi) the term "T6" represents a sixth temperature that is cooler than the fifth temperature, (vii) the term "T7" represents a seventh temperature that is cooler than the sixth temperature, and (viii) the term "T8" represents an eighth temperature that is cooler than the seventh temperature.

Referring to both FIGS. 3C and 4, with the present design, for each mirror 332, heat generated in the mirror 332 is conducted out through the mirror mounting region 370 within the mirror slot 374. The primary purpose of the mirror slot 374 is to minimize the amount of material of the mirror 352 carrying a thermal gradient that causes overall bending distortion, while maximizing the amount of material of the mirror 352 not carrying a thermal gradient that causes overall bending distortion. As illustrated in FIG. 4, during operation of the system, (i) the mirror perimeter region 372 is at a substantially even temperature and does not have a significant thermal gradient, and (ii) the mirror mounting region 370 has a temperature that varies along the mirror mounting region 370 and thus carries a thermal gradient. In the example illustrated in FIG. 4, the mirror perimeter region 372 is at a substantially constant temperature of T1. In contrast, the mirror mounting region 370 has a temperature of T2 near the reflective first surface 352B, a temperature of T3 intermediate the reflective first surface 352B and the mounting second surface 352C, and a temperature of T4 near the mounting second surface 352C.

The secondary purpose of the mirror slot 374 is to make the mirror mounting region 370 (at a center of the mirror body above the neutral bending axis) to be cooler than the mirror perimeter region 372. The differential expansion between the cooler and warmer regions causes a reverse bending distortion of the mirror 352 that can be used to counteract distortion caused by the thermal gradient that causes overall bending.

Somewhat similarly, with the present invention, the plate slots 358 are cut into the first plate surface 350B, and the symmetry slots 362 (not shown in FIG. 3C) are cut into the second plate surface 350C (not shown in FIG. 3C) of the back plate 350. The purpose of the plate slots 358 and the symmetry slots 362 are to minimize the amount of material of the back plate 350 carrying thermal gradients that cause overall bending distortion, while maximizing the amount of material of the back plate 350 not carrying a thermal gradient that causes overall bending distortion. The purpose of the symmetry slots 362 is to achieve structural symmetry above and below the neutral axis (e.g. the longitudinal plane 350D) of the back plate 350. The circulation channels 368 are arranged in a symmetric manner about the neutral axis (e.g. the longitudinal plane 350D) to minimize vertical, asymmetrical thermal gradients, which cause bending distortion. By achieving thermal and structural symmetry and by minimizing the percentage of material carrying asymmetrical thermal gradients, the distortion of the back plate 350 is minimized.

As illustrated in FIG. 4, during operation of the system, (i) the plate surrounding region 363 of the back plate 350 is at a substantially even temperature and does not have a significant thermal gradient, (ii) the symmetry region 360 of the back plate 350 is at a substantially even temperature and does not have a significant thermal gradient, and (iii) the plate mounting regions 356 have a temperature that varies along the plate mounting region 356 and thus carries a thermal gradient. In the example illustrated in FIG. 4, the plate surrounding region 363 is at a substantially constant temperature of T8, and the symmetry region 360 is at a substantially constant temperature of T7. In contrast, the plate mounting regions 356 have a temperature of T5 near the first plate surface 350B, and a temperature of T6 near the longitudinal plane 350D.

In one embodiment, the gradient carrying portion of the mirror body 352A (e.g. the mirror mounting region 370) and/or the gradient carrying portion of the back plate 350 (e.g. the plate mounting regions 356) can be made of a porous material to minimize the volume of the material subjected to a temperature gradient. Examples of suitable materials include copper, molybdenum and silicon.

In yet another embodiment, the gradient carrying portion of the mirror body 352A (e.g. the mirror mounting region 370) and/or the gradient carrying portion of the back plate 350

(e.g. the plate mounting regions 356) can be made of a more compliant material than the rest of the respective structure that is at a uniform temperature. Examples of suitable materials include aluminum and brass.

Figure 5A:
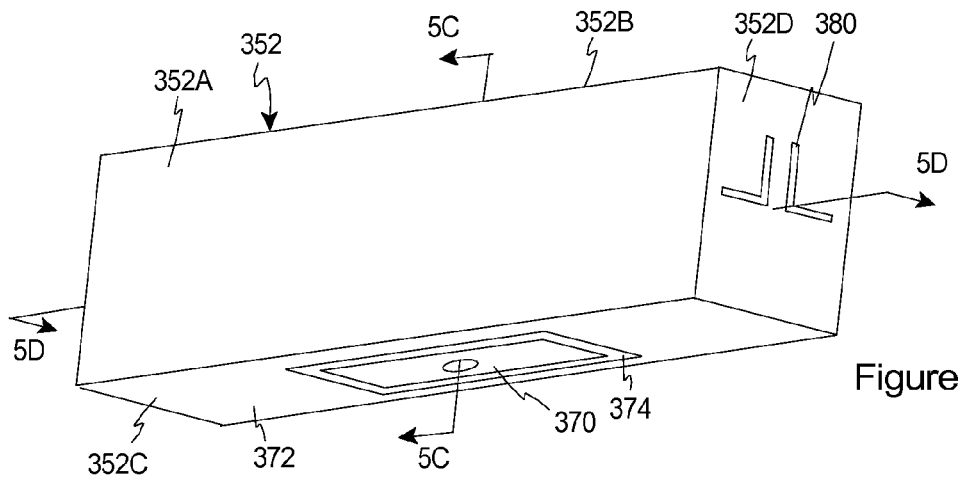
FIG. 5A is a bottom perspective view of a mirror having features of the present invention.
Figure 5B:
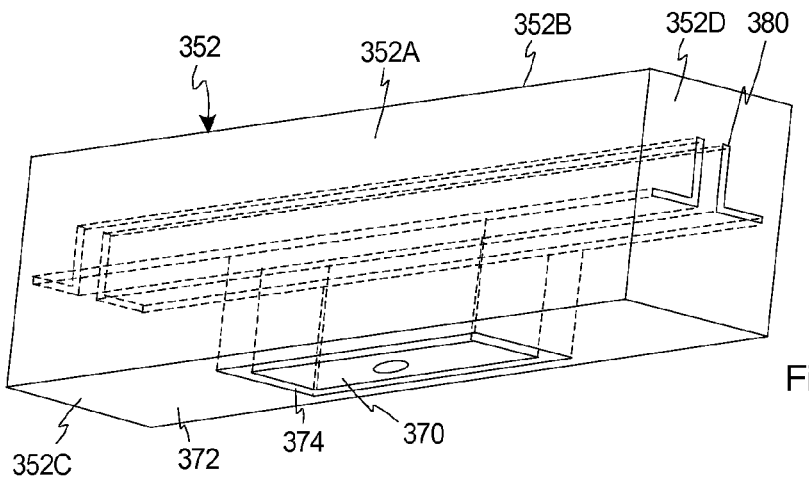
FIG. 5B is a bottom perspective view of the mirror of FIG. 5A with the hidden portions of the mirror illustrated in phantom.
Figure 5C:
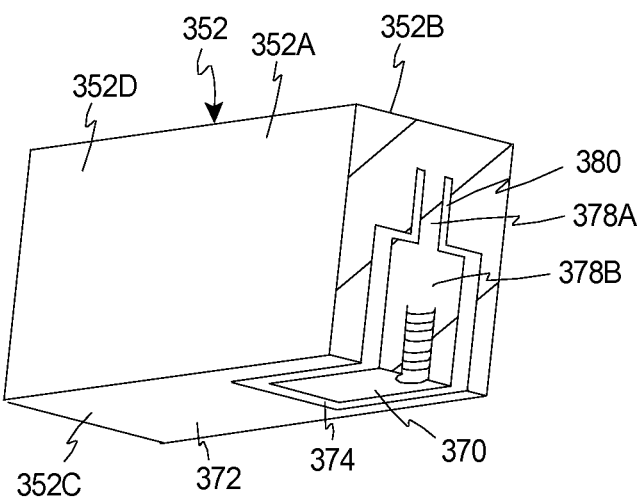
FIG. 5C is a cut-away view taken on line 5C-5C in FIG. 5A.
Figure 5D:
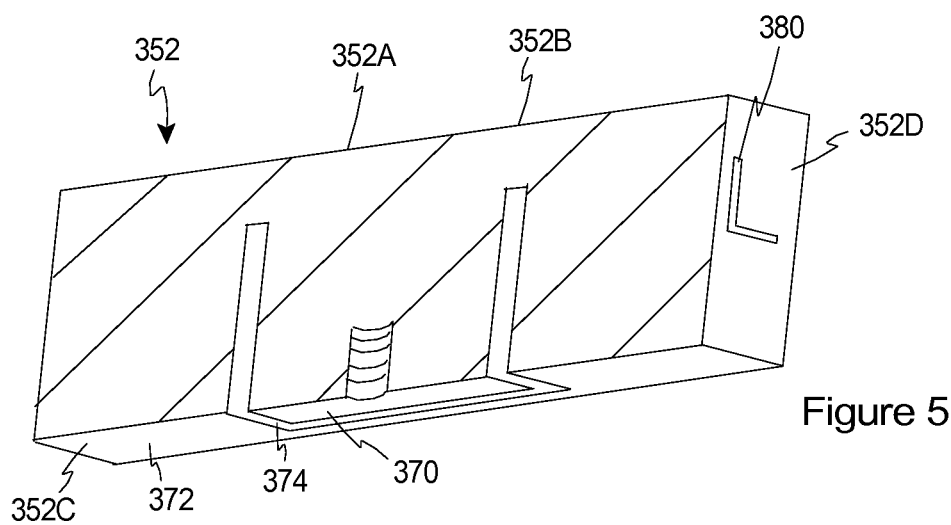
FIG. 5D is a cut-away view taken on line 5D-5D in FIG. 5A.

FIG. 5A is a bottom perspective view of one embodiment of the mirror 352, FIG. 5B is a bottom perspective view of the mirror 352 with certain hidden portions of the mirror 352 illustrated in phantom, FIG. 5C is a cut-away view of the mirror 352, and FIG. 5D is another cut-away view of the mirror 352. These Figures illustrate the mirror body 352A including the reflective first surface 352B, the mounting second surface 352C, and the sides 352D. These Figures also illustrate the mirror mounting region 370, the mirror perimeter region 372, and the mirror slot 374. Additionally, as illustrated in FIG. 5C, in this embodiment, the mirror mounting region 370 includes an upper mounting section 378A, and a lower mounting section 378B. For example, in this embodiment, each mounting section 378A, 378B is generally rectangular beam shaped, and the lower mounting section 378B is wider than the upper mounting section 378A. Further, in this embodiment, the mirror 352 includes a pair of "L" shaped slots 380 that allow the lower mounting section 378B to be wider than the upper mounting section 378A.

Figure 6A:
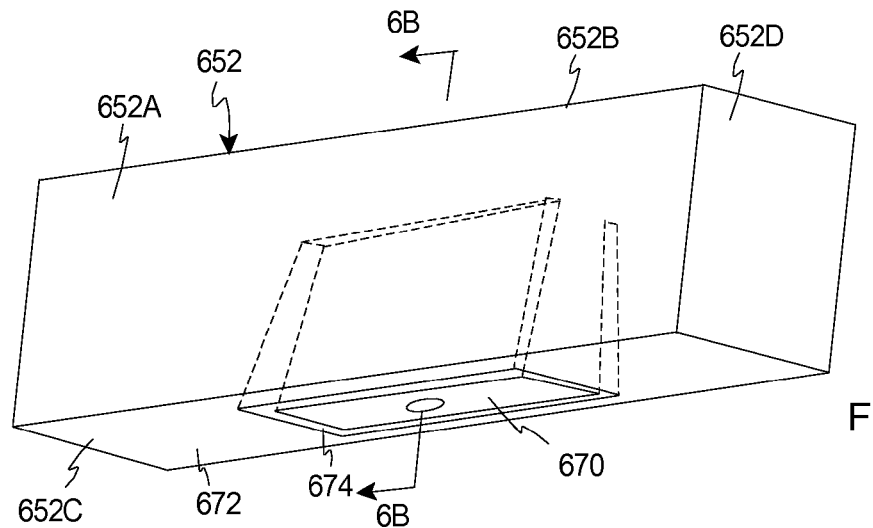
FIG. 6A is a bottom perspective view of another embodiment of a mirror having features of the present invention with certain hidden portions of the mirror illustrated in phantom.
Figure 6B:
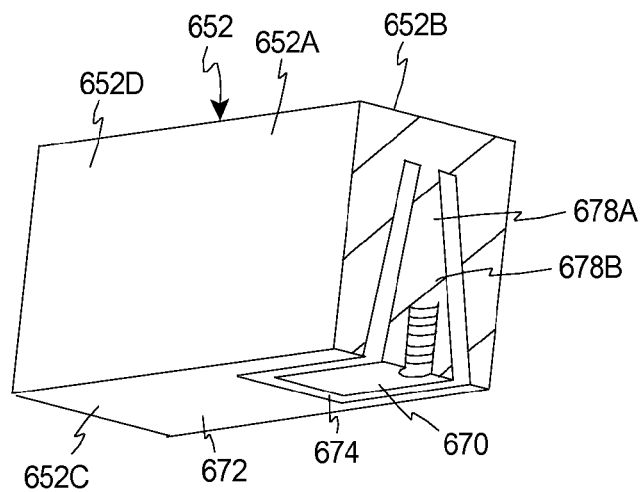
FIG. 6B is a cut-away view taken on line 6B-6B in FIG. 6A.

FIG. 6A is a bottom perspective view of another embodiment of the mirror 652 with certain hidden portions of the mirror 352 illustrated in phantom, and FIG. 6B is a cut-away view of the mirror 652. These Figures illustrate that in this embodiment, the mirror body 652A includes the reflective first surface 652B, the mounting second surface 652C, and the sides 652D. These Figures also illustrate the mirror mounting region 670, the mirror perimeter region 672, and the mirror slot 674. In this embodiment, the mirror mounting region 670 is shaped somewhat similar to a pyramid.

Figure 7:
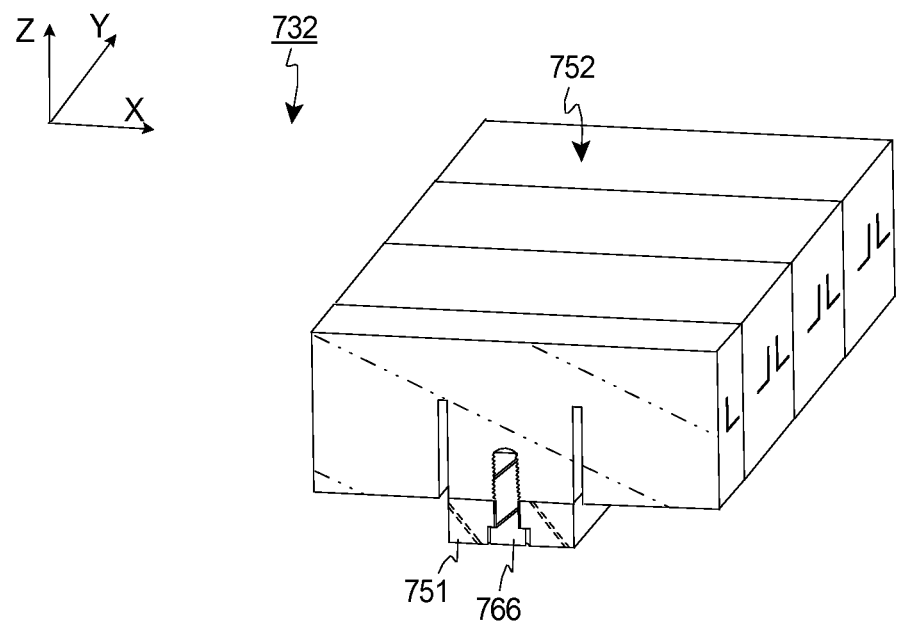
FIG. 7 is a perspective, cut-away view of another embodiment of a mirror assembly having features of the present invention.

FIG. 7 is a perspective, cut-away view of a portion of another embodiment of a mirror assembly 732 having features of the present invention. In this embodiment, the mirror assembly 732 includes a plurality of individual mirrors 752 that are secured to a common frame member 751. In this embodiment, the mirrors 752 can be similar to the mirrors 352 described above. Further, in this embodiment, the frame member 751 includes a rigid beam that retains and secures multiple mirrors 752. As a non-exclusive example, each mirror 752 can be secured with one or more fasteners 766 to the frame member 751. In one embodiment, the frame member 751 with the multiple mirrors 752 can be secured to a back plate (not shown) or another structure.

Figure 8:
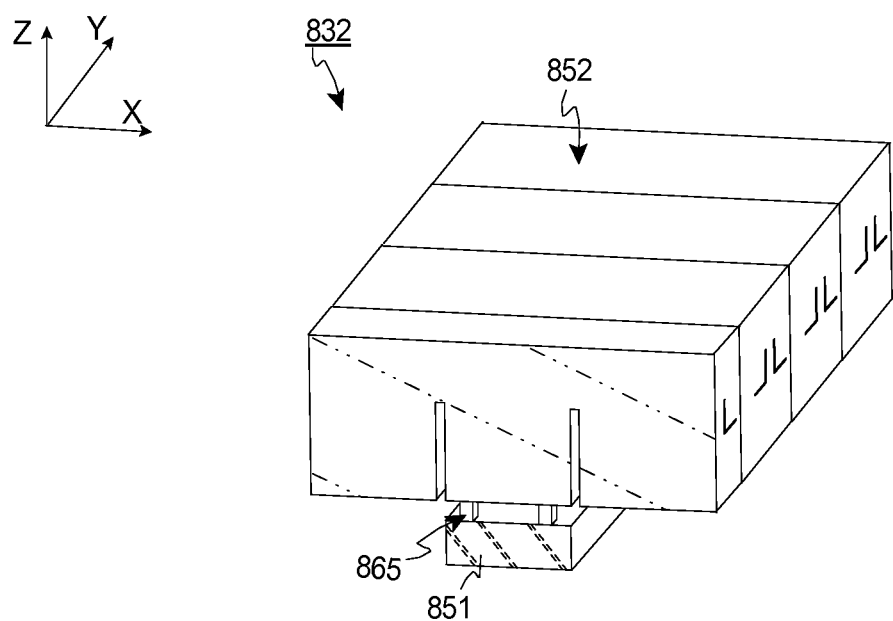
FIG. 8 is a perspective, cut-away view of still another embodiment of a mirror assembly having features of the present invention.

FIG. 8 is a perspective, cut-away view of a portion of yet another embodiment of a mirror assembly 832 having features of the present invention. In this embodiment, the mirror assembly 832 is somewhat similar to the mirror assembly 732 described above and illustrated in FIG. 7. However, in the embodiment illustrated in FIG. 8, the mirror assembly 832 includes a mover assembly 865 (illustrated as a pair of boxes) for one or more of the mirrors 852. For example, the mirror assembly 832 can include a separate mover assembly 865 for each of the mirrors 852.

In one embodiment, each mover assembly 865 can individually and selectively move the respective mirror 852 relative to the other mirrors 852 and the frame member 851. With this design, the mirrors 852 of the mirror assembly 832 can be individually adjusted to adjust the characteristics of the beam (not shown in FIG. 8) reflected off of the mirror assembly 865. In this embodiment, the mirror assembly 832 is an individual driven, fly-eye optical system. In this type of the system, the plurality of mirrors 852 can be individually moved so they can be changed an illumination light freely.

The type of movement provided by the mover assembly 865 can be varied to achieve the desired beam adjustment. For example, each mover assembly 865 can selectively tip and tilt one of the mirrors 852 while constraining the mirror 852 along the X, Y, and Z axes. Each mover assembly 865 can include one or more actuators.

Figure 9A:
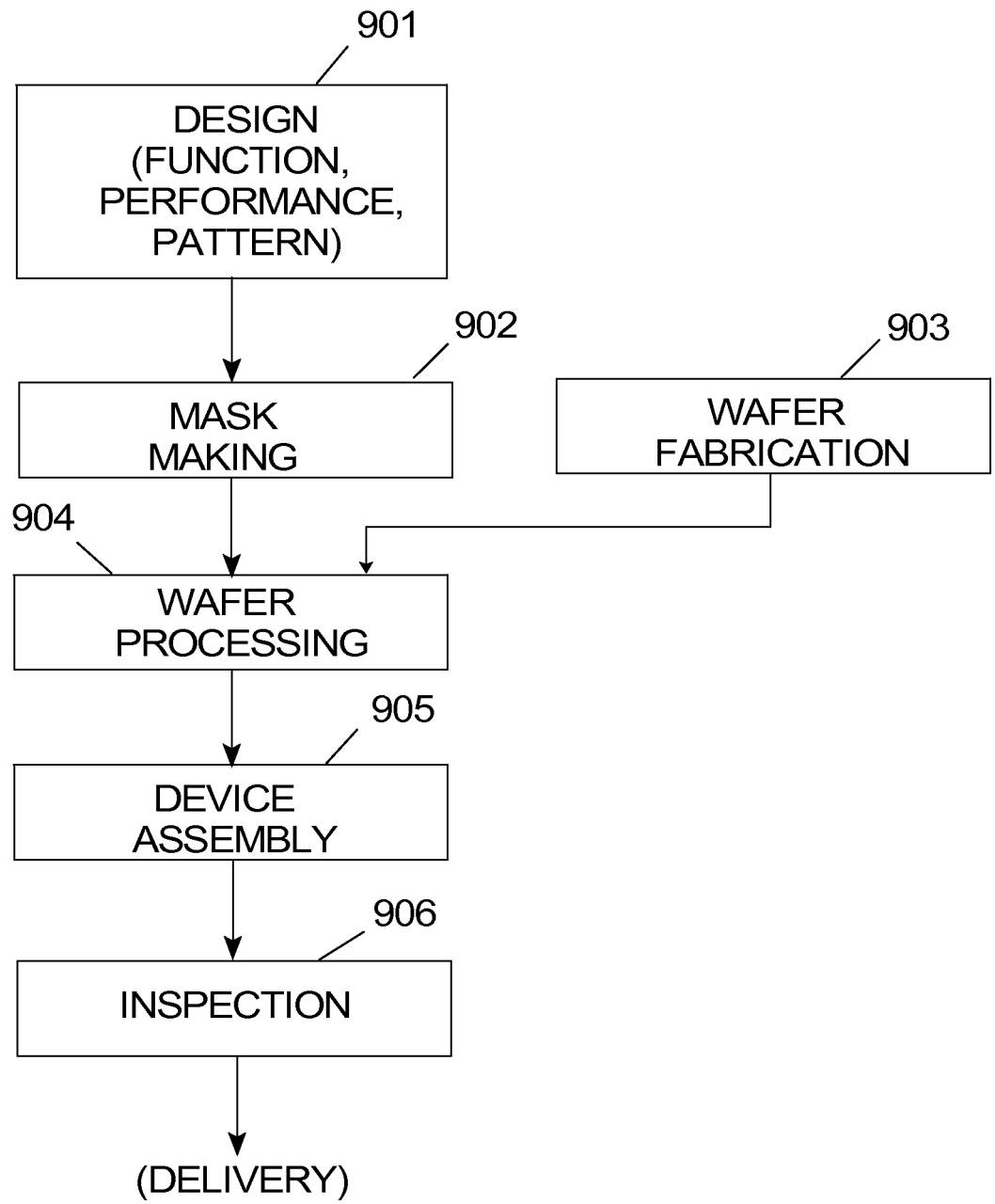
FIG. 9A is a flow chart that outlines a process for manufacturing a device in accordance with the present invention.

Semiconductor devices can be fabricated using the above described systems, by the process shown generally in FIG. 9A. In step 901 the device's function and performance characteristics are designed. Next, in step 902, a mask (reticle) having a pattern is designed according to the previous designing step, and in a parallel step 903 a wafer is made from a silicon material. The mask pattern designed in step 902 is exposed onto the wafer from step 903 in step 904 by a photolithography system described hereinabove in accordance with the present invention. In step 905, the semiconductor device is assembled (including the dicing process, bonding process and packaging process), finally, the device is then inspected in step 906.

Figure 9B:
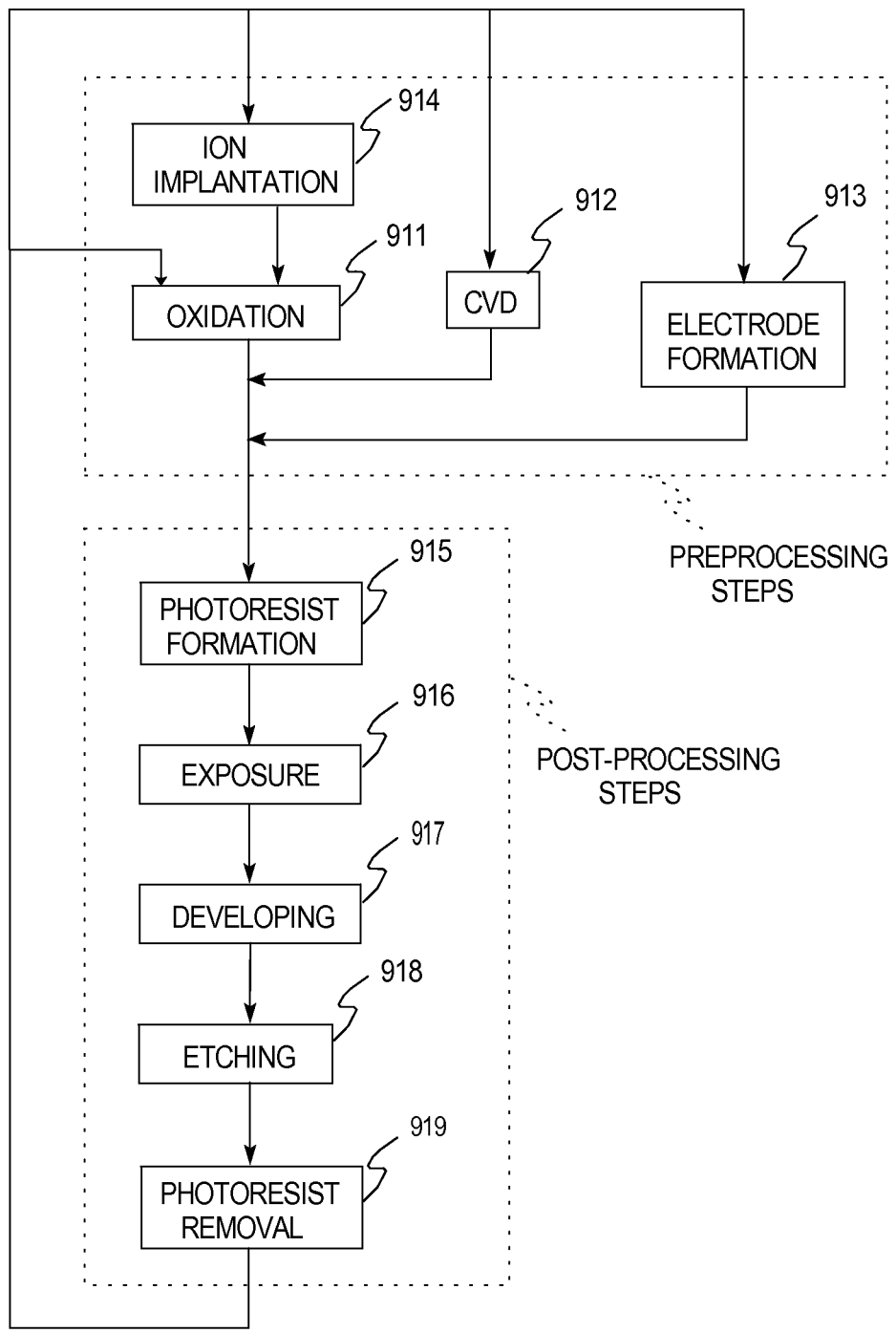
FIG. 9B is a flow chart that outlines device processing in more detail.

FIG. 9B illustrates a detailed flowchart example of the above-mentioned step 904 in the case of fabricating semiconductor devices. In FIG. 9B, in step 911 (oxidation step), the wafer surface is oxidized. In step 912 (CVD step), an insulation film is formed on the wafer surface. In step 913 (electrode formation step), electrodes are formed on the wafer by vapor deposition. In step 914 (ion implantation step), ions are implanted in the wafer. The above mentioned steps 911-914 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 915 (photoresist formation step), photoresist is applied to a wafer. Next, in step 916 (exposure step), the above-mentioned exposure device is used to transfer the circuit pattern of a mask (reticle) to a wafer. Then in step 917 (developing step), the exposed wafer is developed, and in step 918 (etching step), parts other than residual photoresist (exposed material surface) are removed by etching. In step 919 (photoresist removal step), unnecessary photoresist remaining after etching is removed. Multiple circuit patterns are formed by repetition of these preprocessing and post-processing steps.

While the method and system as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A mirror assembly for directing a beam, the mirror assembly comprising:
   a first mirror that includes a mirror body that defines a reflective, first surface that directs the beam, a second surface that is substantially opposite the first surface, a first mounting region, a perimeter region that encircles the first mounting region, and a first slot that separates the perimeter region from the first mounting region; and
   a back member that retains the first mirror, the back member including a body that defines a second mounting region and a surrounding region that encircles the second mounting region, wherein the second mounting region retains the first mounting region of the first mirror with the perimeter region spaced apart a gap from the body, and with a portion of the second surface within the perimeter region being adjacent to and facing the surrounding region.

2. The mirror assembly of claim 1 wherein the first mounting region extends from the second surface to near the first surface.

3. The mirror assembly of claim 1 wherein the first slot extends from the second surface to near the first surface.

4. The mirror assembly of claim 1 wherein the first mounting region is substantially rectangular shaped.

5. The mirror assembly of claim 1 wherein the first mounting region is substantially pyramid shaped.

6. The mirror assembly of claim 1 wherein the back member includes a second slot that encircles the second mounting region and separates the second mounting region from the surrounding region.

7. The mirror assembly of claim 6 wherein the body includes a longitudinal axis, and wherein the body defines a symmetry region that is opposite the second mounting region relative to the longitudinal axis, and a symmetry slot that encircles the symmetry region.

8. The mirror assembly of claim 6 wherein the back member includes a circulation conduit for directing a circulation fluid through the back member to control the temperature of the back member.

9. The mirror assembly of claim 8 further comprising a second mirror that includes a mirror body that defines a reflective, first surface that directs the beam, a first mounting region, a perimeter region that encircles the first mounting region, and a first slot that separates the perimeter region from the first mounting region; and wherein the back member retains the first mounting region of the second mirror with the perimeter region spaced apart from the body of the back member.

10. An exposure assembly for transferring an image from a reticle to a wafer, the exposure assembly comprising: a reticle stage that retains and positions the reticle; a wafer stage that retains and positions the wafer; an illumination source that generates a beam; and the mirror assembly of claim 1 that directs the beam from the illumination source to the reticle.

11. A process for manufacturing a device that includes the steps of providing a substrate and forming an image on the substrate with the exposure apparatus of claim 10.

12. A mirror assembly for directing a beam, the mirror assembly comprising:
  a first mirror that includes a mirror body that defines a reflective, first surface that directs the beam, a second surface that is substantially opposite the first surface, a first mounting region, and a perimeter region that encircles the first mounting region; and
  a back member that includes a body that defines a second mounting region, a surrounding region that encircles the second mounting region, and a second slot that separates the second mounting region from the surrounding region; wherein the second mounting region retains the first mounting region of the first mirror with the perimeter region spaced apart a gap from the body, and with a portion of the second surface within the perimeter region being adjacent to and facing the surrounding region.

13. The mirror assembly of claim 12 further comprising a second mirror that includes a mirror body that defines a reflective, first surface that directs the beam, a first mounting region, and a perimeter region that encircles the first mounting region; and wherein the body defines a third mounting region, and a third slot that separates the third mounting region from the surrounding region; wherein the third mounting region retains the first mounting region of the second mirror with the perimeter region of the second mirror spaced apart and adjacent to the surrounding region.

14. The mirror assembly of claim 13 wherein the body includes a longitudinal axis; and wherein the body defines a first symmetry region that is opposite the second mounting region relative to the longitudinal axis, a third slot that encircles the first symmetry region, a second symmetry region that is substantially opposite the third mounting region relative to the longitudinal axis, and a fourth slot that encircles the second symmetry region.

15. The mirror assembly of claim 12 wherein the body includes a longitudinal axis; and wherein the body defines a first symmetry region that is opposite the second mounting region relative to the longitudinal axis, and a third slot that encircles the first symmetry region.

16. The mirror assembly of claim 12 wherein the back member includes a circulation conduit for directing a circulation fluid through the back member to control the temperature of the back member.

17. An exposure assembly for transferring an image from a reticle to a wafer, the exposure assembly comprising: a reticle stage that retains and positions the reticle; a wafer stage that retains and positions the wafer; an illumination source that generates a beam; and the mirror assembly of claim 12 for directing the beam from the illumination source to the reticle.

18. A process for manufacturing a device that includes the steps of providing a substrate and forming an image on the substrate with the exposure apparatus of claim 17.

19. A method for directing a beam, the method comprising the steps of:
  positioning a first mirror in a path of the beam, the first mirror including a mirror body that defines a reflective, first surface that directs the beam, a second surface that is substantially opposite the first surface, a first mounting region, a perimeter region that encircles the first mounting region, and a first slot that separates the perimeter region from the first mounting region; and
  securing the first mounting region of the first mirror to a back member, the back member including a body that defines a second mounting region and a surrounding region that encircles the second mounting region, wherein the second mounting region retains the first mounting region of the first mirror with the perimeter region spaced apart a gap from the body of the back member, and with a portion of the second surface within the perimeter region being adjacent to and facing the surrounding region.

20. The method of claim 19 further comprising the step of positioning a second mirror in the path of the beam, the second mirror including a mirror body that defines a reflective, first surface that directs the beam, a first mounting region, a perimeter region that encircles the first mounting region, and a first slot that separates the perimeter region from the first mounting region; and wherein the back member plate retains the first mounting region of the second mirror with the perimeter region of the second mirror spaced apart from the body of the back member.

21. The method of claim 19 wherein the back member has a second slot that encircles the second mounting region and separates the second mounting region from the surrounding region.

22. A method for directing a beam, the method comprising the steps of:
  positioning a first mirror in a path of the beam, the first mirror including a mirror body that defines a reflective, first surface that directs the beam, a second surface that is substantially opposite the first surface, a first mounting region, and a perimeter region that encircles the first mounting region;

providing a back member that includes a body that defines a second mounting region, a surrounding region that encircles the second mounting region, and a first slot that separates the second mounting region from the surrounding region; and securing the first mounting region of the first mirror to the second mounting region with the perimeter region spaced apart a gap from the body of the back member, and with a portion of the second surface within the perimeter region being adjacent to and facing the surrounding region.

23. The method of claim 22 further comprising the step of positioning a second mirror in the path of the beam, the second mirror includes a mirror body that defines a reflective, first surface that directs the beam, a first mounting region, and a perimeter region that encircles the first mounting region, and the back member includes the body defining a third mounting region, and a second slot that separates the third mounting region from the surrounding region; and securing the first mounting region of the second mirror to the second plate mounting region with the perimeter region spaced apart from and adjacent to the surrounding region.

24. The method of claim 22 wherein the body has a longitudinal axis, and the body defines a first symmetry region that is opposite the second mounting region relative to the longitudinal axis, and a third slot that encircles the first symmetry region.

25. The method of claim 22 further comprising the step of directing a circulation fluid through the back member to control the temperature of the back member.

* * * * *